United States Patent [19]
Kato

[11] Patent Number: 5,682,203
[45] Date of Patent: Oct. 28, 1997

[54] SOLID-STATE IMAGE SENSING DEVICE AND PHOTO-TAKING SYSTEM UTILIZING CONDENSER TYPE MICRO-LENSES

[75] Inventor: Masatake Kato, Kunitachi, Japan

[73] Assignee: Canon Kabushiki Kaisha, Tokyo, Japan

[21] Appl. No.: 15,435

[22] Filed: Feb. 9, 1993

[30] Foreign Application Priority Data

Feb. 14, 1992 [JP] Japan .................................. 4-059750

[51] Int. Cl.$^6$ ................................................ H04N 5/225
[52] U.S. Cl. ................................ 348/340; 359/619
[58] Field of Search ........................ 358/209, 225, 358/229, 108; 359/218, 652, 654, 618, 619; 257/295, 432, 433, 434, 436, 448; 348/294, 311, 335, 340, 243; H04N 5/225

[56] References Cited

U.S. PATENT DOCUMENTS

| | | | |
|---|---|---|---|
| 4,054,361 | 10/1977 | Noguchi | 359/218 |
| 4,496,209 | 1/1985 | Itoh et al. | 359/218 |
| 4,554,585 | 11/1985 | Carlson | 348/342 |
| 4,667,092 | 5/1987 | Ishihara | 250/216 |
| 5,132,251 | 7/1992 | Kim et al. | 437/225 |
| 5,151,790 | 9/1992 | Takatori et al. | 358/225 |
| 5,239,412 | 8/1993 | Naka et al. | 359/619 |
| 5,251,038 | 10/1993 | Hirota | 348/340 |
| 5,270,859 | 12/1993 | Wirth et al. | 359/419 |

FOREIGN PATENT DOCUMENTS

| | | | |
|---|---|---|---|
| 63-86481 | 4/1988 | Japan | H01L 31/10 |
| 1-213079 | 8/1989 | Japan | H04N 5/335 |
| 0318354 | 3/1991 | Japan | |
| 3-152971 | 6/1991 | Japan | H04N 5/335 |

OTHER PUBLICATIONS

Ishihara, et al., "A High Photosensitivity IL–CCD Image Sensor With Monolithic Resin Lens Array," IEEE, IEDM, Dec. 1983, pp. 497 through 500.

*Primary Examiner*—Andrew Faile
*Assistant Examiner*—Tuan Y. Ho
*Attorney, Agent, or Firm*—Fitzpatrick, Cella, Harper & Scinto

[57] ABSTRACT

A solid-state image sensing device including a plurality of photo cells provided on a substrate and a plurality of micro condenser members each provided on a corresponding photo cell. The interval at which the micro condenser members are arranged at a central portion of the substrate differs from the interval at which the micro condenser members are arranged at a peripheral portion. Further, a center of the micro condenser member and a center of the photo cell may coincide with each other at the central portion of the substrate and may shift from each other at the peripheral portion thereof. Also, a power of the micro condenser members arranged at the central portion of the substrate may differ from a power of the micro condenser members arranged at the peripheral portion thereof. Additionally, the image sensing device may be included in an image taking system with a photo-taking lens which is not telecentric, wherein the solid-state image sensing device receives an object image formed by the photo-taking lens.

9 Claims, 4 Drawing Sheets

SOLID-STATE IMAGE SENSING DEVICE AND PHOTO-TAKING SYSTEM UTILIZING CONDENSER TYPE MICRO-LENSES

BACKGROUND OF THE INVENTION

1. Field of the Invention

The present invention relates to a solid-state image sensing device, and more particularly, to a solid-state image sensing device, such as an area sensor or a line sensor, in which a condenser-type micro lens is provided on the light-incident side of each of a plurality of photo cells (light-receiving portions) arranged at a predetermined pitch in such a manner that the micro lens faces the corresponding photo cell. The present invention also relates to a photo-taking system which employs such a solid-state image sensing device.

2. Description of the Related Art

Solid-state image sensing devices employing solid-state image sensors, such as an area sensor or a line sensor, are known in the art. These image sensors having a plurality of condenser-type micro lenses are arranged at a predetermined pitch on the light-incident side of a plurality of photo cells (light-receiving portions) arranged at a predetermined pitch in such a manner that each of the micro lenses faces the corresponding photo cell in order to improve the light detection efficiency thereof.

The manufacture of the micro lens has been described in, for example, IEDM (IEEE) 83, page 497–499.

When a convex lens is disposed on the photo cell, the intensity of light incident on the photo cell is determined not by the aperture of the photo cell, but by the aperture of the convex lens.

Thus, even when the area of the photo cell that is serving as a pixel formed on a chip decreases as a consequence of a reduction in the size of the chip and of an increase in the number of pixels, and hence the intensity of light received by each of the photo cells decreases, a reduction in the detection sensitivity can be prevented.

FIG. 3 is an enlarged view of a conventional color solid-state imaging device of the above-described type.

In the figure, a plurality of photo cells (light-receiving portions) (22a, 22b, 22c, 22d), each of which is a photo diode, and a plurality of transfer portions (23a, 23b, 23c, 23d), for transferring the electric charges generated and stored in the corresponding photo cells, are provided on the surface of a semiconductor substrate 21. One-chip color filters 24R, 24G, 24B . . . , made of gelatin or casein and colored red R, green G and blue B, are formed on the light-incident side of the photo cells (22a, 22b, 22c, 22d, . . . ), and a plurality of micro lenses (25a, 25b, 25c, 25d, . . . ) are formed on the light-incident side of the color filters.

In the above-described arrangement, the light detection efficiency with which light is detected by the photo cell is increased.

The micro lens used in a conventional solid-state image sensing device has an optimum refractive power and a shape such that it can condense light from infinity on the photo cell. Therefore, a photo-taking lens (objective lens) with such a solid-state image sensing device provided on an image surface thereof, as a photoelectric conversion means, is a so-called telecentric optical system whose exit pupil is located at infinity.

In a telecentric optical system, on-axial and off-axial principal rays are incident on both the micro lenses provided at the central portion and the peripheral portion of an image sensing surface, which is substantially perpendicular thereto. Consequently, the entire field is subjected to a uniform optical effect, and a uniform image can thus be obtained on the entire field.

In recent years, the chip size of the solid-state image sensing device has been reduced, thereby increasing demands for a reduction in the size of the photo-taking lens. Furthermore, in a rear focusing type zoom lens, the exit pupil thereof may shift toward the solid-state image sensing device side when the zoom lens is focused in a certain state.

As the size of the photo-taking lens is reduced, the exit pupil thereof, i.e., the virtual image of an aperture-stop as viewed from the focal plane side, generally shifts closer, making off-axial principal rays RA slantingly incident on the periphery of the imaging surface with respect to the optical axis, as shown in FIG. 4.

Consequently, light rays RL, directed from a photo-taking lens 31 toward the periphery of the image sensing surface, may be incident on the micro lenses (25a, 25b, 25c, 25d, . . . ), positioned in such a manner that they face the corresponding periodically arranged photo cells (22a, 22b, . . . ), under different conditions. That is, the light condensing state of each micro lens may differ in individual micro lenses. For example, most of the light may not enter the photo cells at the peripheral portion of the image sensing surface. RA indicates off-axial principal rays.

As a result, the intensity of light received by the photo cells provided on the peripheral portion of the screen may decrease with respect to the intensity of light received by the photo cells provided on the central portion, generating so-called luminous shading.

A reduction in the size of the photo-taking lens also generates problems in that the image obtained by a video camera may deteriorate to such an extent that it cannot be used in an actual operation, and in that when auto focusing is performed using a video signal, the object located on the periphery of the screen may not be focused.

SUMMARY OF THE INVENTION

An object of the present invention is to provide a solid-state image sensing device, which assures excellent image quality.

Another object of the present invention is to provide a solid-state image sensing device, which allows no shading to be generated, even when a photo-taking lens is in a non-telecentric state, and a photo-taking system which employs such a solid-state image sensing device.

Another object of the present invention is to provide a solid-state image sensing device in which a plurality of photo cells are arranged on the surface of a substrate at a fixed interval and in which a plurality of micro condenser members are arranged in such a manner that they face the corresponding photo cells at different intervals, depending on whether the micro condenser is located at a central portion or a peripheral portion of the substrate.

Another object of the present invention is to provide a solid-state image sensing device wherein the interval at which the micro condenser members are arranged on the central portion of the substrate is made shorter than the interval on the peripheral portion, and wherein the interval at which the micro condenser members are arranged differs only in the longitudinal direction of a substrate having a rectangular shape.

To achieve the above-described objects, the present invention provides a solid-state image sensing device in which a plurality of photo cells are provided on a substrate and a plurality of micro condenser members are provided each on the corresponding photo cell. In the present invention, the interval at which the micro condenser members are arranged at a central portion of the substrate differs from the interval at which the micro condenser members are arranged at a peripheral portion.

The present invention further provides a solid-state image sensing device in which a plurality of photo cells are provided on a substrate and a plurality of micro condenser members are each provided on the corresponding photo cell, and which is characterized in that a center of the micro condenser member and a center of the photo cell coincide with each other at a central portion of the substrate and shift from each other at a peripheral portion thereof.

The present invention further provides a solid-state image sensing device in which a plurality of photo cells are provided on a substrate and a plurality of micro condenser members are each provided on the corresponding photo cell, and which is characterized in that a power of the micro condenser members that are arranged at a central portion of the substrate differs from a power of the micro condenser members arranged at a peripheral portion of the substrate.

The present invention further provides an image taking system which comprises a photo-taking lens, which is not telecentric, and a solid-state image sensing device for receiving an object image formed by the photo-taking lens. The solid-state image sensing device includes a plurality of photo cells provided on a substrate and a plurality of micro condenser members each provided on the corresponding photo cell. The interval at which the micro condenser members are arranged at a peripheral portion of the substrate is shorter than interval at which the micro condenser members are arranged at a central portion.

According to one aspect, the present invention relates to a solid-state image sensing device for use with a substrate having central and peripheral portions and having a plurality of photocells. The solid-state image sensing device comprises a plurality of micro condenser members each provided on a corresponding one of the plurality of photocells, wherein a first interval, at which the plurality of micro condenser members are arranged at the central portion of the substrate, differs from a second interval, at which the micro condenser members are arranged at the peripheral portion of the substrate.

According to another aspect, the present invention relates to a solid-state image sensing device for use with substrate having a central and peripheral portions and having a plurality of photocells. The solid-state image sensing device comprises a plurality of micro condenser members each provided on a corresponding one of the plurality of photocells, wherein a center of each of the photocells that is located at the central portion of the substrate coincides with respect to a center of the micro condenser provided thereon, and wherein the center of each of the photocells that is located at the peripheral portion of the substrate shifts with respect to the center of the micro condenser provided thereon.

In still another aspect, the present invention relates to a solid-state image sensing device for use with a substrate having central and peripheral portions and having a plurality of the photocells. The solid-state image sensing device comprises a plurality of micro condenser members each provided on a corresponding one of the plurality of photocells, wherein a power of the micro condenser members that are arranged at the central portion of the substrate differs from a power of the micro condenser members that are arranged at the peripheral portion of the substrate.

According to yet another aspect, the present invention relates to an image taking system including a solid-state image sensing device, the image taking system comprising a photographic lens having a non-telecentric arrangement and a solid-state image sensing device for receiving an image of an object, wherein the image is formed by the photographic lens. The solid-state image sensing device comprises a substrate having a central and a peripheral portion and having a plurality of photocells, and a plurality of micro condenser members each provided on a corresponding one of the plurality of photocells, wherein a first interval, at which the micro condenser members are arranged at the peripheral portion of the substrate, is shorter than a second interval, at which the micro condenser members are arranged at the central portion of the substrate.

Other objects and advantages of the invention will become apparent during the following discussion of embodiments with reference to the accompanying drawings.

DETAILED DESCRIPTION OF THE PREFERRED EMBODIMENTS

Figure 1:
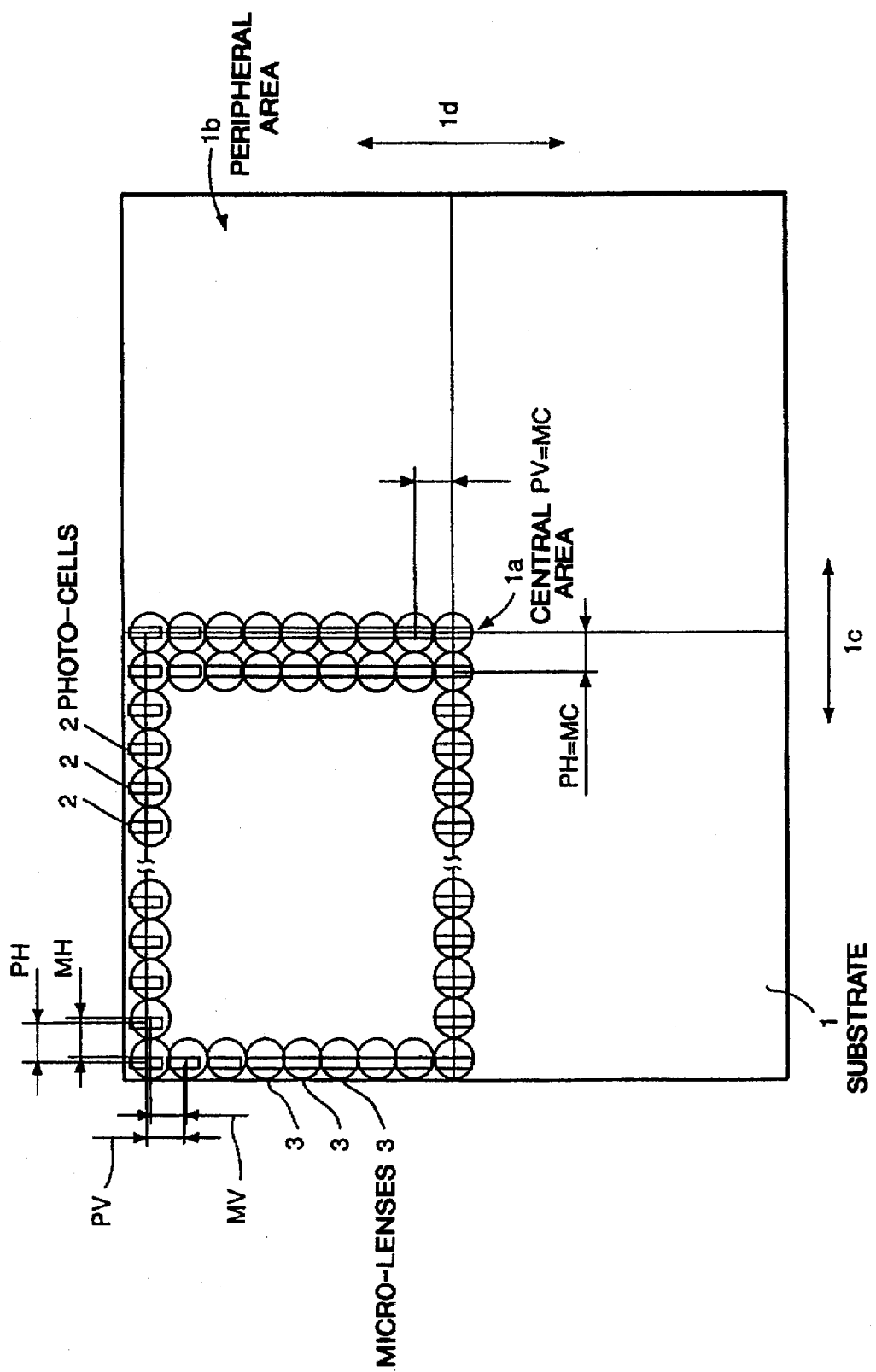
FIG. 1 is a plan view of an embodiment of the present invention.
Figure 2:
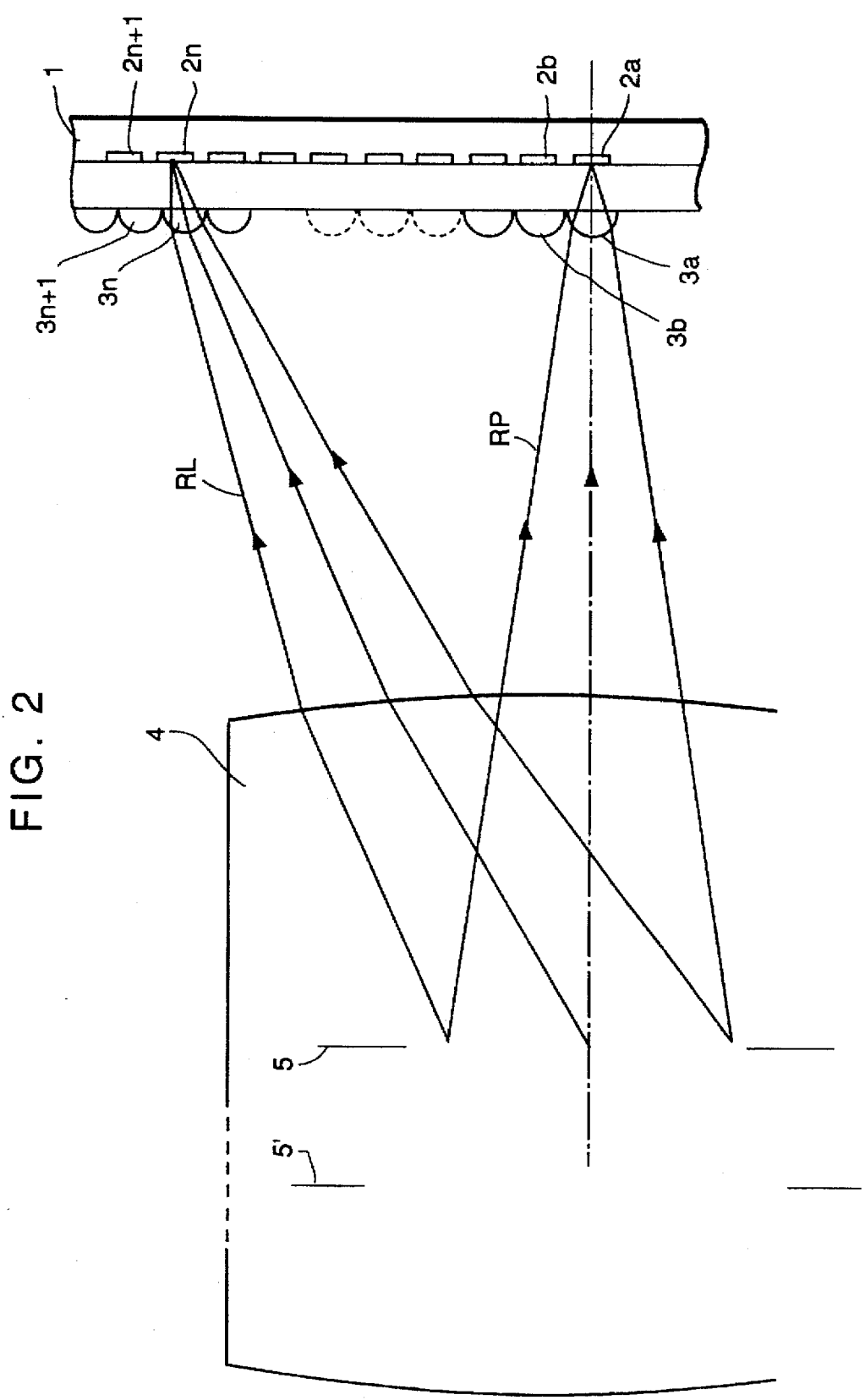
FIG. 2 is a partial cross-sectional view of the embodiment of the present invention.
Figure 3:
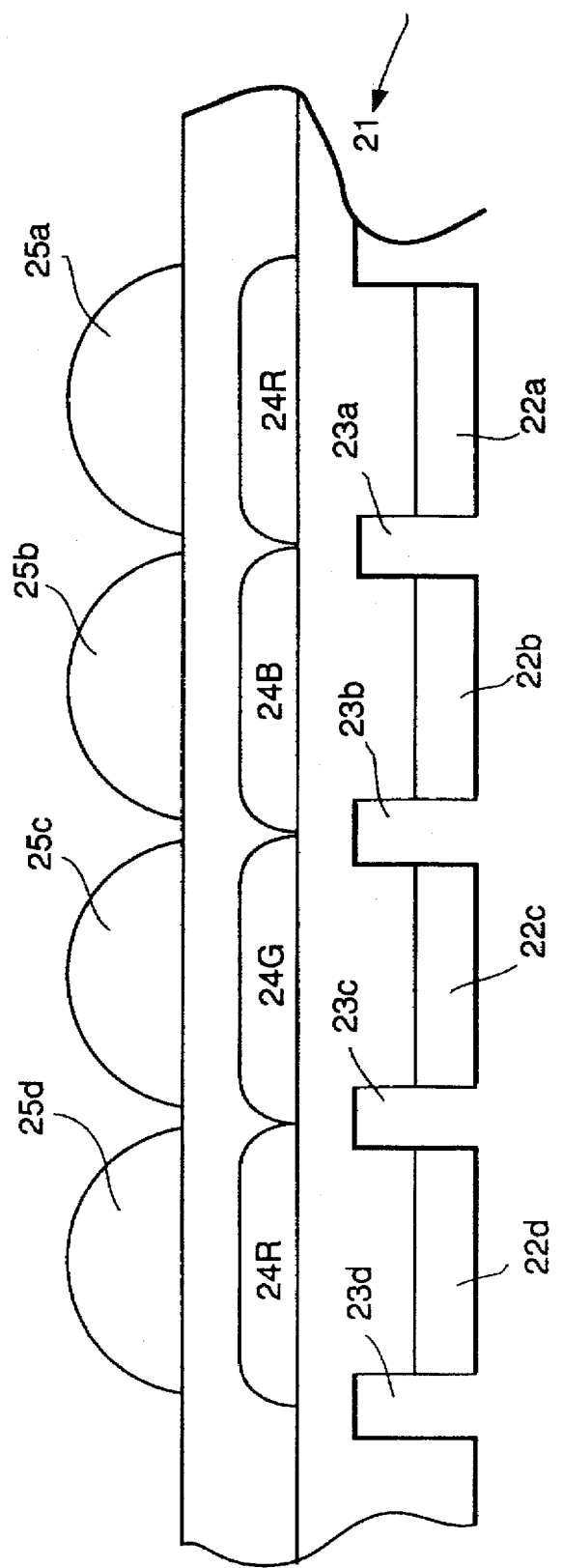
FIG. 3 is a partial enlarged view of a conventional solid-state imaging device.
Figure 4:
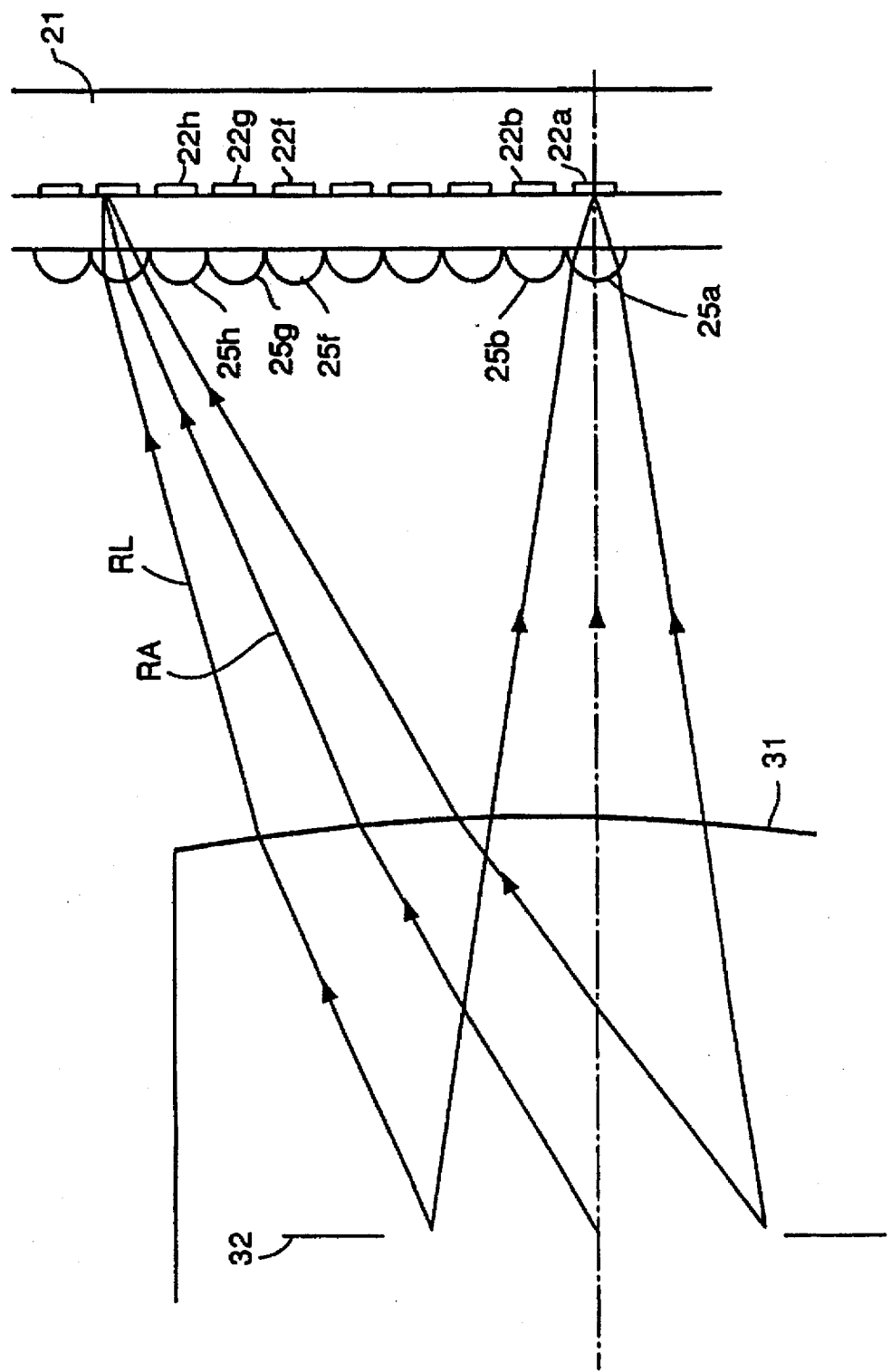
FIG. 4 illustrates shading generated on the peripheral portion of a screen.

FIG. 1 is a view of an embodiment of a solid-state image sensing device according to the present invention as seen when looking from the light incident side of the solid-state image sensing device. FIG. 2 is a cross-sectional view of the solid-state image sensing device shown in FIG. 1.

In these figures, a rectangular substrate 1 has a central area 1a, and a peripheral area 1b.

Photo cells (light-receiving portions) 2 (2a, 2b, ...), which may be a CCD or photo diodes, are arranged on the surface of the substrate 1 at an interval PH in the longitudinal (horizontal) direction 1c and at an interval PV in the lateral (vertical) direction 1d. In FIGS. 1 and 2, the light-receiving surface of each of the photo cells 2 is elongated in the lateral direction 1d.

In FIG. 1, only the photo cells 2 that are located at the central area 1a of the entire surface of the substrate 1 and those photo cells 2 that are located on part of an area, which includes the peripheral area 1b, are shown to simply the illustration.

Micro lenses 3 (3a, 3b, ...) are provided on the surface of the substrate 1 and have a one-to-one correspondence with the photo cells 2 (2a, 2b, ...). The micro lenses 3 may have a convex surface.

FIG. 1 shows the micro lenses 3 in the same manner as that of the photo cells 2. That is, only the micro lenses 3 that are located on the central area 1a of the substrate and those that are located on part of one area, which includes the peripheral portion, are shown in FIG. 1. The intervals at which the micro lenses 3 are arranged differ between the central area 1a and the peripheral area 1b of the substrate 1.

In this embodiment, the micro lenses 3 that are arranged near the central area 1a of the surface of the substrate 1 are at the same interval MC in both the longitudinal direction 1c and the lateral direction 1d. The micro lenses 3 that are arranged on the peripheral area 1b are at an interval MH in the longitudinal direction 1c and at an interval MV in the lateral direction 1d. At that time, MC≧MV and MC>MH. In addition, the interval MH in the longitudinal direction 1c varies continuously or stepwise between the central area 1a and the peripheral area 1b of the substrate 1. The intervals PH and PV of the photo cells 2 and the intervals MH and MV of the micro lenses 3 have a relationship expressed by:

MH<PH

MV≦PV.

FIG. 2 shows the optical path obtained when the solid-state image sensing device according to the present invention is provided on the image surface of a photo-taking lens. In this figure, a photo-taking lens 4 may be a rear-focusing type zoom lens. The photo-taking lens 4 has an aperture 5 and an exit pupil 5'.

In the solid-state image sensing device shown in FIG. 2, the micro lenses 3a, 3b, ... 3n+1 are arranged on the periphery of the screen at intervals shorter than the interval at which the micro lenses are disposed on the center of the screen in order to improve the micro lens function of condensing the light to the photo cell. Consequently, the intensity of light at which light rays RP, which are incident on the center of the screen (near the optical axis), enter the photo cell 2a is made substantially equal to the intensity of light at which light rays RL, which are incident on the peripheral portion of the image field, enter the photo cell 2n.

Thus, even when a non-telecentric photo-taking lens is employed, since the intensity of light that is incident on the photo cell located on the peripheral portion of the image field is substantially equal to the intensity of light that is incident on the photo cell located at the central portion of the screen, a uniform and excellent wide signal can be obtained over the entire image field in the present invention.

When the light-receiving surface of each of the photo cells 2 is elongated in the lateral direction, less luminous shading is generated in the lateral direction. Therefore, the interval MV of the micro lenses 3, in the lateral direction, may be made the same as the interval PV of the photo cells 2 and may be made the same over the entire image field.

The micro lenses may also be arranged in a manner where the intervals at which the micro lenses 3 are arranged are either changed or not changed. In this embodiment, the shape of the micro lenses 3 may be changed, e.g., the curvature and hence the power of the micro lenses 3 may be increased sequentially or stepwise, toward the periphery of the screen.

In the previous embodiments, a single spherical lens is provided for each of the photo cells. However, a cylindrical lens, having a curvature only in the longitudinal direction of the substrate may also be employed.

Furthermore, the present embodiment of the invention assures the same effect even if the intervals at which the micro lenses are arranged are the same over the entire surface of the substrate while the intervals at which the photo cells are arranged at the peripheral portion of the substrate are longer than the intervals at which the photo cells are arranged at the central portion.

Furthermore, the present invention assures the same effect even if a plurality of fine optical elements, which do not have a convex shape, but instead have a flat plate-like shape, and whose inner refractive index changes radially and continuously and which have the function of converging the light rays incident thereto, are arranged in a transparent flat plate at the same interval as any of the aforementioned cycles.

As will be understood from the foregoing description of the present invention, since the intervals at which the plurality of photo cells are arranged and the intervals at which the plurality of micro lenses are arranged are set adequately, even if a non-telecentric photo-taking lens is used, it is possible to obtain a uniform intensity of light over the entire screen and hence a good-quality image having no luminous shading.

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A solid-state image sensing device for use with a substrate having central and peripheral portions and having a plurality of photocells, said solid-state image sensing device comprising:

a plurality of micro condenser lenses each provided on a corresponding one of said plurality of photocells, wherein a power of said micro condenser lenses arranged at the central portion of said substrate differs from a power of said micro condenser lenses arranged at the peripheral portion of said substrate.

2. A solid-state image sensing device according to claim 1, wherein the power of said micro condenser lenses is stronger at the peripheral portion of said substrate than at the central portion of said substrate.

3. A solid-state image sensing device according to claim 2, wherein each of said plurality of micro condenser lenses has a convex surface and wherein a curvature of said micro condenser lenses increases as the position of said micro condenser lenses approaches the peripheral portion of said substrate.

4. An image taking apparatus comprising:

an imaging optical system for forming an image of an object, in which the image side is not telecentric; and an image sensor for receiving the image of the object, said image sensor comprising a plurality of photocells and a plurality of micro condenser lenses each provided on a corresponding one of said plurality of photocells, wherein a first interval of the photocells arranged at a peripheral portion of said image sensor, is different from a second interval of the photocells arranged at a central portion of said image sensor, an interval of said micro condenser lenses arranged at said peripheral portion of said image sensor being the same as an interval of said micro condenser lenses arranged at the central portion of said image sensor.

5. An image taking apparatus according to claim 4, wherein the first interval is larger than the second interval.

6. An image taking apparatus comprising:

an imaging optical system for forming an image of an object, in which the image side is not telecentric; and an image sensor for receiving the image of the object, said image sensor comprising a plurality of photocells and a plurality of micro condenser lenses each provided on a corresponding one of said plurality of photocells, wherein a first refracting power of the micro condenser lenses arranged at a peripheral portion of said image sensor, is different from a second refracting power of the micro condenser lenses arranged at a central portion of said image sensor.

7. An image taking apparatus according to claim 6, wherein the first refracting power is stronger than the second refracting power.

8. A solid-state image sensing device comprising:

an image sensor having a plurality of photocells; and a plurality of micro condenser lenses each provided on a corresponding one of said plurality of photocells, a first interval of the photocells arranged at the peripheral portion of said image sensor being different from a second interval of the photocells arranged at a central portion of said image sensor, an interval of said micro condenser lenses arranged at said peripheral portion of said image sensor being the same as an interval of said micro condenser lenses arranged at the central portion of said image sensor.

9. A device according to claim 8, wherein the first interval is greater than the second interval.

* * * * *

UNITED STATES PATENT AND TRADEMARK OFFICE
CERTIFICATE OF CORRECTION

PATENT NO. : 5,682,203
DATED : October 28, 1997
INVENTOR(S) : MASATAKE KATO

It is certified that error appears in the above-identified patent and that said Letters Patent is hereby corrected as shown below:

On the title page:

<u>At [56] Foreign Patent Documents</u>

"0318354  3/1991  Japan" should read
--3-18354  3/1991  Japan--.

<u>Column 4</u>

Line 10, "a" (second and third occurrences) should be deleted.

Line 11, "portion" should read --portions--.

Line 19, "of" should read --of the--.

Line 52, "simply" should read --simplify--.

Signed and Sealed this

Sixteenth Day of June, 1998

Attest:

BRUCE LEHMAN

Attesting Officer

Commissioner of Patents and Trademarks